(12) United States Patent
Mann et al.

(10) Patent No.: US 6,327,157 B1
(45) Date of Patent: Dec. 4, 2001

(54) HIGH-CURRENT POWER BUS SYSTEM

(75) Inventors: Kristina L Mann; Charles Henry Rock; Samuel M. Babb, all of Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/405,935

(22) Filed: Sep. 27, 1999

(51) Int. Cl.[7] .................................................. H01R 9/00
(52) U.S. Cl. ....................... 361/775; 361/641; 361/648; 361/624; 361/637
(58) Field of Search ................................. 361/730, 736, 361/735, 752, 775, 637, 641, 639, 624, 648

(56) References Cited

U.S. PATENT DOCUMENTS 5,532,907 * 7/1996 Asselta et al. ...................... 361/775

OTHER PUBLICATIONS

"Power Distribution Systems from Eldre" (Advertisement of Eldre Corporation, Rochester, NY), PCIM Power Electronic Systems Magazine, Jul. 1999.

* cited by examiner

Primary Examiner—Jayprakash N. Gandhi
Assistant Examiner—Thanh Yen Tran
(74) Attorney, Agent, or Firm—Kevin M. Hart

(57) ABSTRACT

A two-piece bus bar electrically couples a printed circuit board to a power supply. The power supply is mounted to a chassis. A power supply bus bar extends from the power supply, defining a power supply bus bar plane. A first printed circuit board is mounted to the chassis and oriented in a plane that is not parallel with the power supply bus bar plane. A first printed circuit board bus bar extends from the first printed circuit board. At least one of the power supply bus bar or the first printed circuit board bus bar includes a bend that creates a parallel relationship between a mating portion of the power supply bus bar and a mating portion of the first printed circuit board bus bar. A first fastener couples the mating portions of the bus bars together. A second printed circuit board may be mounted to the chassis and oriented in a plane at right angles with the power supply bus bar plane. A second printed circuit board bus bar extends from the second printed circuit board and includes a 90-degree bend and a 180-degree bend such that a mating portion of the second printed circuit board bus bar is parallel with the power supply bus bar plane. A resilient conductive member having a convex surface is disposed within a channel formed in one of the bus bars to enhance electrical contact between the bus bars. Shock and short-circuit hazards are reduced with a removable insulating shield.

19 Claims, 12 Drawing Sheets

HIGH-CURRENT POWER BUS SYSTEM

FIELD OF THE INVENTION

This invention relates to methods and apparatus for distributing power from a power supply to one or more printed circuit boards in a computer or other electronic system that utilizes a power supply and printed circuit boards.

BACKGROUND

Numerous methods have been employed for busing power in electronic systems from a power supply to printed circuit boards.

Wires/Cables. One method has been to communicate power from the power supply to the printed circuit boards by means of discrete wires or cables. Although this method may be desirable for use in relatively low-current systems, large-current systems require wires or cables having large diameters so that the resistive and inductive characteristics of the wires or cables do not unacceptably degrade power delivery performance. Large-diameter wires and cables are problematic because they are stiff, and therefore pose routing difficulties. In addition, large-diameter cables require bulky and expensive connectors at the points of engagement between the wire or cable and the power supply or printed circuit boards. Moreover, large-diameter wires and cables degrade the ability to access other components of a system housed within the same chassis; often, such wires or cables must be removed before access to other components is possible.

Laminated Foil Straps. Another method has been to communicate power by means of straps formed with laminated copper foil layers, often with one lug on each end for engagement with the power supply or printed circuit board. One advantage of such laminated foil straps is that they have fairly good resistive and inductive characteristics even when carrying fairly large currents, and they are more flexible than wires or cables. A major disadvantage of laminated foil straps is that they are very expensive.

Traditional Bus Bars. Still another method has been to utilize rigid copper bars called "bus bars" to communicate power from one point to another within an enclosure. Among the advantages of traditional bus bars are their superior resistive and inductive characteristics and their relatively low cost. The disadvantages associated with traditional bus bars, however, are numerous: First, their rigidity creates difficulties in assembling the electronic systems that employ them. These assembly difficulties are especially apparent with regard to the tolerances they require and to the limitations they place on circuit board orientation choices. (Tolerances must be tightly maintained both in locating the bus bars within the chassis and in mounting the printed circuit boards to the chassis; otherwise, the points of engagement at either end of the bus bars will not be properly aligned with their corresponding mating points.)

Second, traditional bus bars present assembly difficulties in terms of making reliable electrical contacts at each bus bar's points of engagement. Usually, it is necessary during the assembly of such systems to use fastening tools that are capable of applying precisely measurable torque to the bolts being used to attach each bus bar to its mating point, thus insuring good electrical contact. But such tools are expensive, and are often unavailable in the field.

Third, traditional bus bars have either been coated with a layer of some kind of insulating material, or have been left exposed without insulation. Insulating the bus bars adds to the expense of the system, and leaving the bars exposed creates possible shock and short circuit hazards.

It is therefore an object of the invention to provide a bus bar system that facilitates flexibility in circuit board orientation while easing the tolerance requirements presented by prior art bus bar systems.

It is a further object of the invention to provide a bus bar system that makes reliable electrical contacts during assembly without the use of precision fastening tools.

It is yet a further object of the invention to provide a bus bar system that is less expensive to manufacture than systems utilizing insulation-covered bus bars, but that still reduces shock and hazard risks relative to systems utilizing exposed bus bars.

SUMMARY OF THE INVENTION

A power bus system according to the invention includes numerous aspects. In a first aspect, a two-piece bus bar is used in lieu of a one-piece bus bar to electrically couple a printed circuit board to a power supply. At least one member of the two-piece bus bar includes a bend. The use of the two-piece bus bar in addition to the use of the bend in at least one of the bus bars facilitates a wider choice of circuit board orientation within the chassis than is available with prior art bus bar systems. In an example embodiment, a power supply is mounted to a chassis. A power supply bus bar extends from the power supply and defines a power supply bus bar plane. A first printed circuit board is mounted to the chassis (for example via a removable printed circuit board carrier tray), and may be oriented in a plane that is not parallel with the power supply bus bar plane. A first printed circuit board bus bar extends from the first printed circuit board. At least one of the power supply bus bar or the first printed circuit board bus bar includes a bend sufficient to create a parallel relationship between a mating portion of the power supply bus bar and a mating portion of the first printed circuit board bus bar. A first fastener couples the mating portion of the power supply bus bar to the mating portion of the first printed circuit board bus bar.

In another aspect, the bend has a sufficiently large radius to facilitate proper engagement of the two pieces of the bus bar when the printed circuit board is inserted into the chassis at assembly time: In an example embodiment, the large-radius bend is included on the printed circuit board bus bar. During assembly, the power supply is installed into the chassis first. Then the printed circuit board having the printed circuit board bus bar already attached to it is inserted into the chassis. As the board is inserted, the large-radius bend causes the printed circuit board bus bar to slip underneath the power supply bus bar as desired.

In a further aspect, a second printed circuit board may be mounted to the chassis and oriented in a plane that is substantially at right angles with the power supply bus bar plane. A second printed circuit board bus bar extends from the second printed circuit board. The second printed circuit board bus bar includes a 90-degree bend and a 180-degree bend such that a mating portion of the second printed circuit board bus bar is oriented at right angles with the plane of the second printed circuit board but parallel with the power supply bus bar plane. A second fastener couples the mating portion of the power supply bus bar to the mating portion of the second printed circuit board bus bar. The unique shape of the second printed circuit board bus bar provides enhanced compliance and resilience characteristics, further alleviating tolerance difficulties. The shape also enables the mating portion of the second printed circuit board bus bar to be centered over the edge of the second printed circuit board, thus conserving space.

In a further aspect, tight tolerances required by prior art bus bar systems are eased by using adjustable fastening points to couple the two members of the two-piece bus bar together, as well as to couple the power supply bus bar to the power supply itself. An adjustable mount according to the invention may be achieved using a screw-type fastener whose screw shaft diameter is smaller than at least one inside dimension of a clearance hole formed in one of the bus bars.

In yet a further aspect, novel techniques are used to engage the printed circuit board bus bars to their respective printed circuit boards, and also to couple the printed circuit board bus bars to the power supply bus bar, thereby insuring reliable electrical contact without the need for precision fastening tools, as follows:

Interface between the printed circuit board and the printed circuit board bus bar. In an example embodiment, the first printed circuit board includes a mounting area for engagement with a mounting portion of the first printed circuit board bus bar. The mounting area includes a plurality of plated through holes, at least one of the plural plated through holes electrically connected to a power trace of the first printed circuit board. The mounting area further includes either a hole formed in the first printed circuit board for receiving a raised locating member formed on the first printed circuit board bus bar, or a raised locating member formed on the first printed circuit board for engaging a hole formed in the first printed circuit board bus bar, or both. A number of factors contribute to the efficacy of the novel mounting arrangement between the printed circuit board bus bar and the printed circuit board: the mounting area formed on the printed circuit board has a large surface area for contacting the bus bar; the surface roughing effect caused by manufacturing the plated through holes enhances the electrical contact; the use of plural plated through holes in the mounting area further enhances the electrical contact; and the use of guide holes and raised members as locating aids not only facilitates assembly, but also enhances electrical contact by properly aligning the mounting area of the printed circuit board with the mounting area of the bus bar.

Interface between the two pieces of the bus bar. In an example embodiment, a channel is formed in the mating portion of at least one of the power supply bus bar or the first printed circuit board bus bar. A resilient conducting member is disposed within the channel. The resilient conducting member has a convex portion that extends beyond the top of the channel. When the power supply bus bar and the printed circuit bus bar are engaged, the convex resilient conducting member is trapped between them and slightly compressed, thus enhancing the electrical contact made between the bus bars. In a preferred embodiment, the resilient conducting member also includes a plurality of slats, each slat rotated slightly about its longitudinal axis so that the edge of each slat makes electrical contact with the mating portion of the bus bar that is urged against it. The slat edges further enhance the reliability of the electrical contact. The resilient conducting member is preferably retained within the channel by deformations created in a portion of a wall of the channel. In this manner, the resilient member remains within the channel even when a frictional force is applied to it along the longitudinal direction of the channel as the printed circuit board is inserted into the chassis.

In yet a further aspect, shock and short-circuit hazards are reduced in a costeffective manner using a removable insulating shield. In an example embodiment, the insulating shield includes a hinge member on one end for engaging the power supply, and a resilient lever on another end. The resilient lever has a catch formed thereon for engaging an end of at least one of the power supply or printed circuit board bus bars.

Once the power supply, printed circuit board and bus bars have been assembled into the chassis, the shield may simply be snapped into place over the top of the otherwise-uninsulated bus bars. The inventive shield enables use of inexpensive uninsulated bus bars without great risk of inadvertent short circuits or shock. If desired, the shield may be removed easily for disassembly or service.

DETAILED DESCRIPTION OF THE PREFERRED EMBODIMENTS

Figure 1:
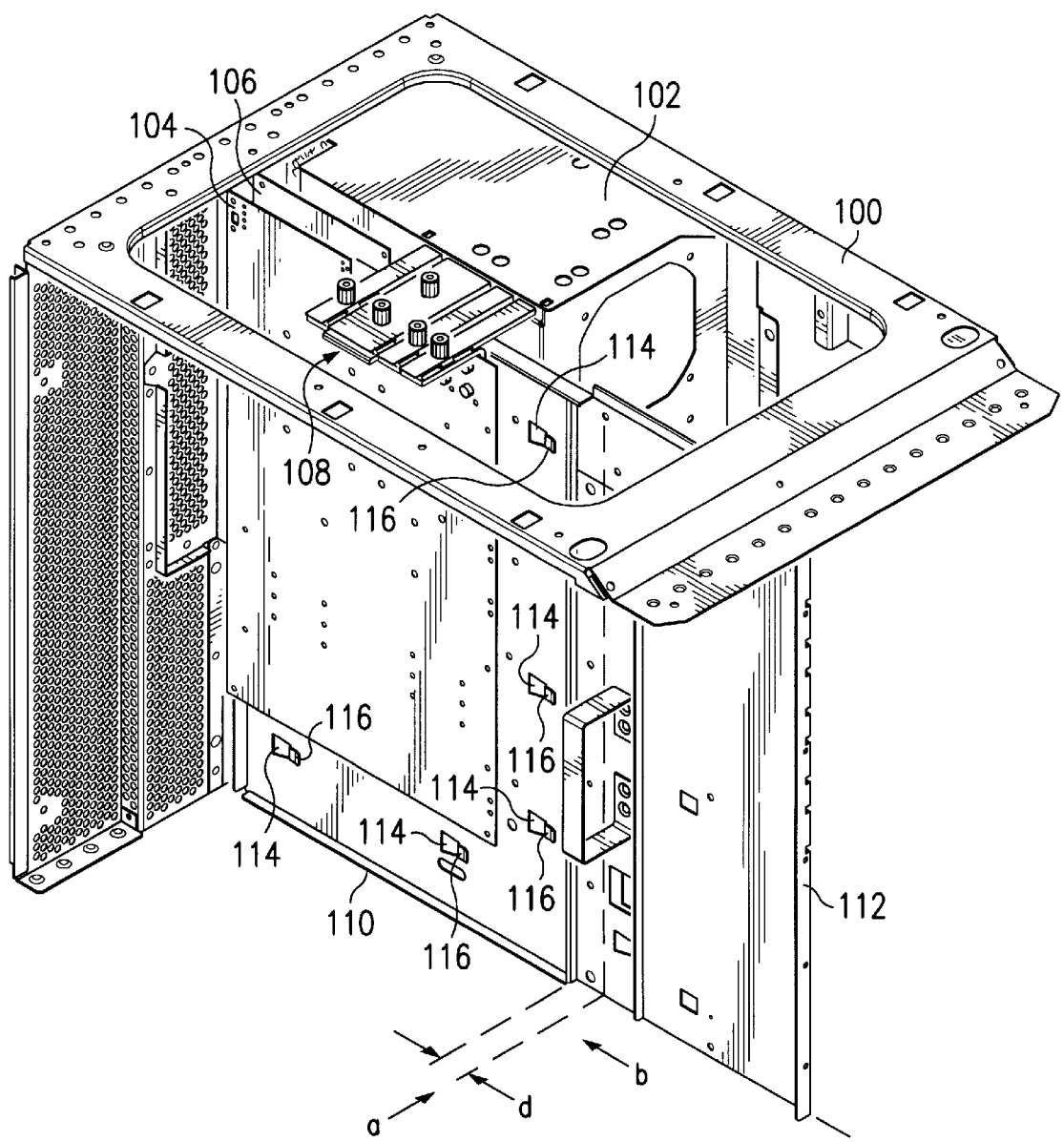
FIG. 1 is an oblique view of a computer chassis having a power supply, first and second printed circuit boards, and a power bus system installed therein according to a preferred embodiment of the invention.

FIG. 1 illustrates a computer chassis 100 having a power supply 102, first and second printed circuit boards 104, 106, and a power bus system 108 installed therein according to a preferred embodiment of the invention. For clarity, chassis 100 is shown having several of its sides removed. Printed circuit boards 104, 106 may be mounted to chassis 100 by any conventional means. In the embodiment shown, chassis 100 includes an interior wall 112. Circuit board 106 is mounted to interior wall 112 directly using bolts and standoffs. Circuit board 104, on the other hand, is mounted to interior wall 112 indirectly using a circuit board carrier 110. A plurality of tabs 116 protrude from interior wall 112 on the side of circuit board 104, and carrier 110 includes a plurality of engagement holes 114. Circuit board 104 is mounted to carrier 110 using bolts and standoffs, and carrier 110 is mounted to interior wall 112 by engaging tabs 116 with holes 114. To accomplish this, carrier 110 is first moved toward interior wall 112 in direction "a" until tabs 116 have passed through holes 114. Then carrier 110 is moved a distance "d" in direction "b" until tabs 116 have passed over one end of holes 114 as shown. In the embodiment shown, circuit board 106 is mounted to interior wall 112 before power supply 102 is installed. After this has been done, power supply 102 may be mounted to chassis 100 by any conventional means, such as by screws or bolts.

Figure 2:
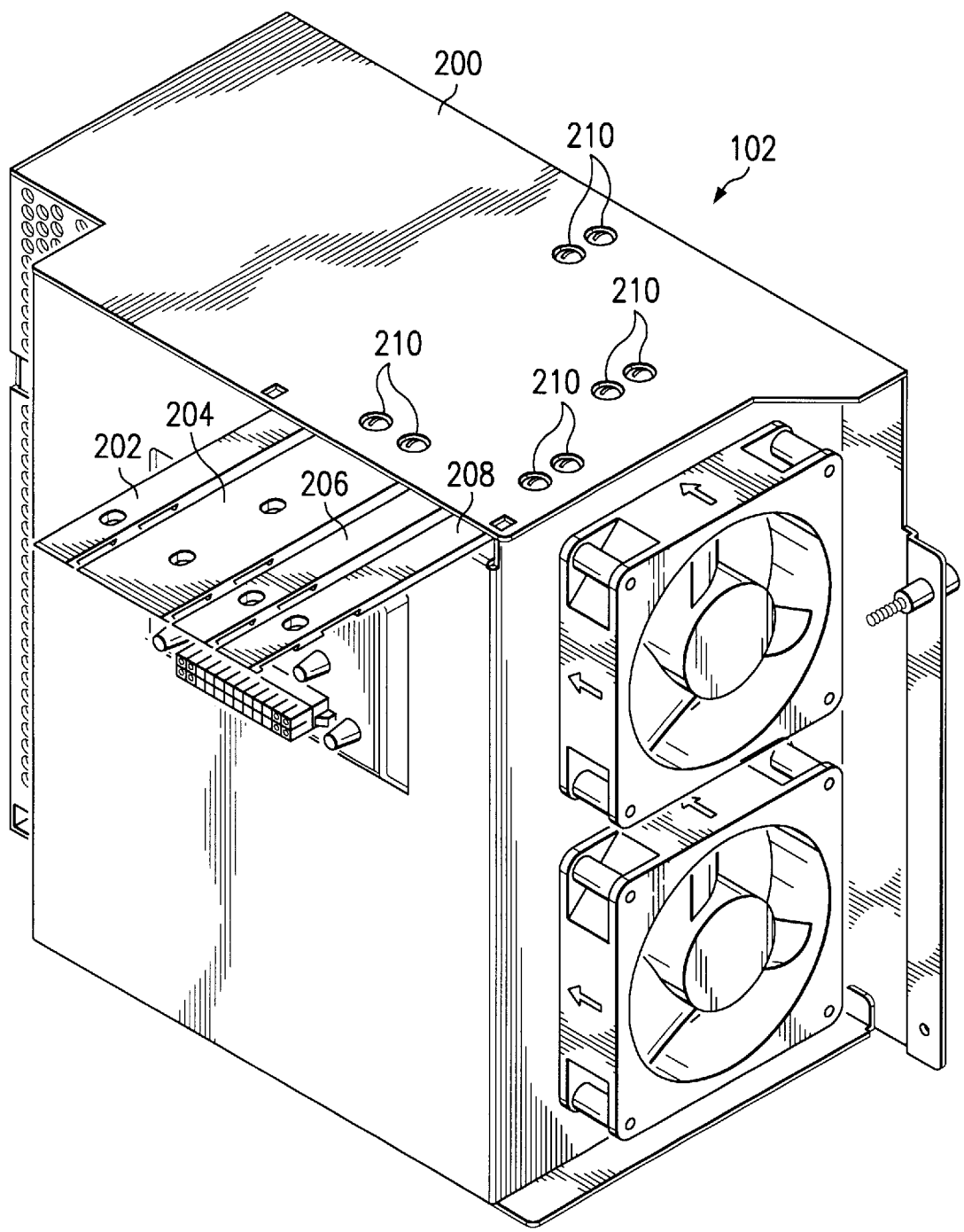
FIG. 2 is an oblique view of the power supply of FIG. 1 having been removed from the chassis.
Figure 3:
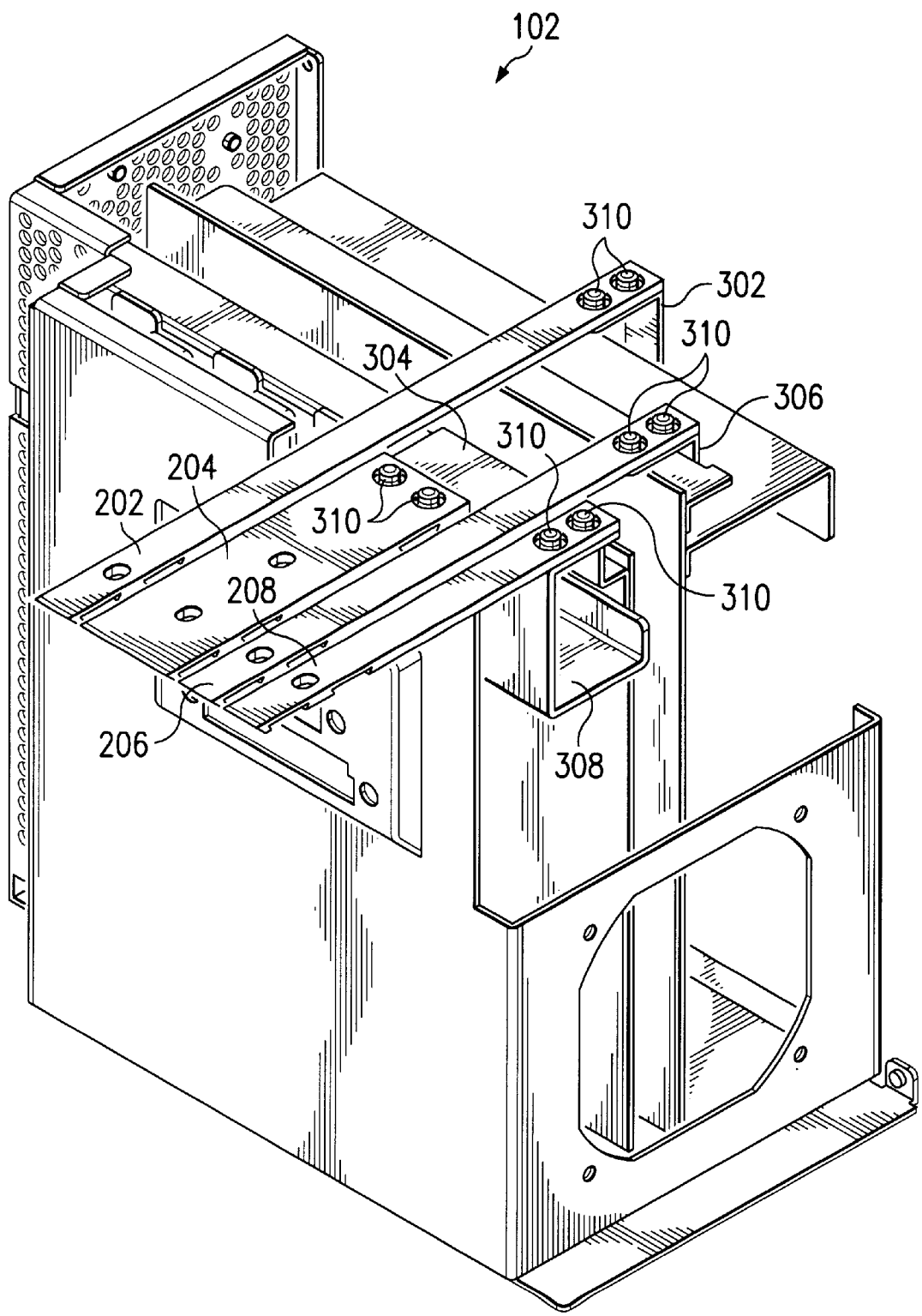
FIG. 3 is an oblique view of the power supply of FIG. 2 with its cover having been removed to show the power supply bus bars in more detail.
Figure 4:
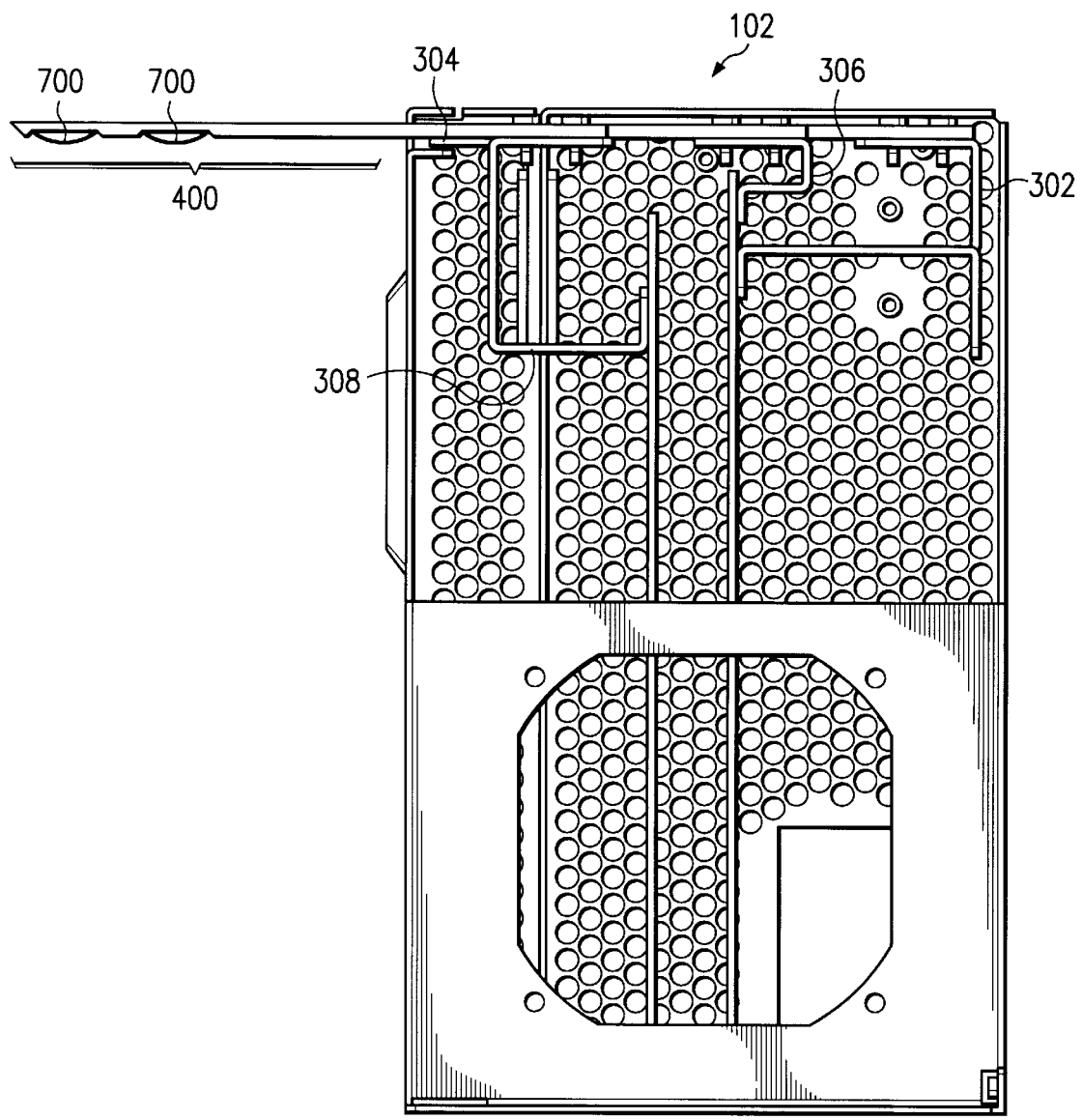
FIG. 4 is a side view of the power supply of FIG. 3.
Figure 5A:
FIG. 5 is a bottom view of the power supply bus bars of FIGS. 2–4.
Figure 5B:
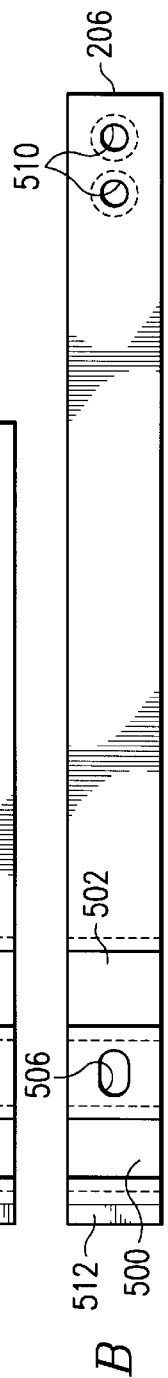
Figure 5C:
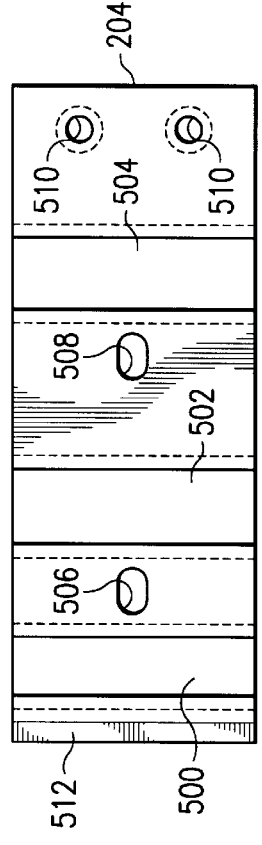
Figure 5D:
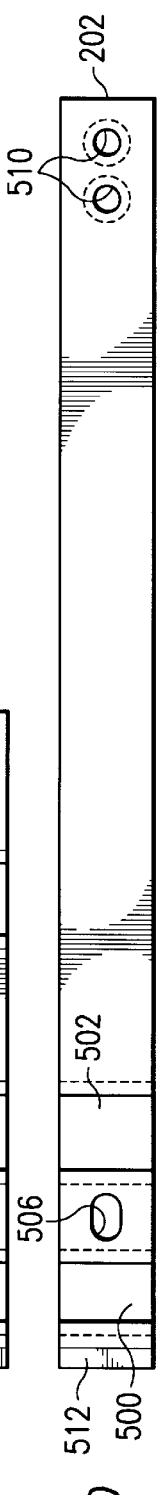

Power supply 102 will now be discussed in detail with reference to FIGS. 2–10. In FIG. 2, power supply 102 is shown enclosed within a housing 200. In FIGS. 3 and 4, power supply 102 is shown with housing 200 having been removed. Power supply bus bars 202–208 are mounted to conductive components 302–308, respectively, internal to power supply 102. Each of power supply bus bars 202–208 has a mating portion 400 that extends outside power supply housing 200. In an embodiment, power supply bus bar 202 was coupled to a 1.8 volt supply, power supply bus bar 204 was coupled to ground, power supply bus bar 206 was coupled to a 48 volt supply, and power supply bus bar 208 was coupled to a 3.3 volt supply. In other embodiments, more or fewer power supply bus bars may be used; each may supply a different voltage.

Figure 6A:
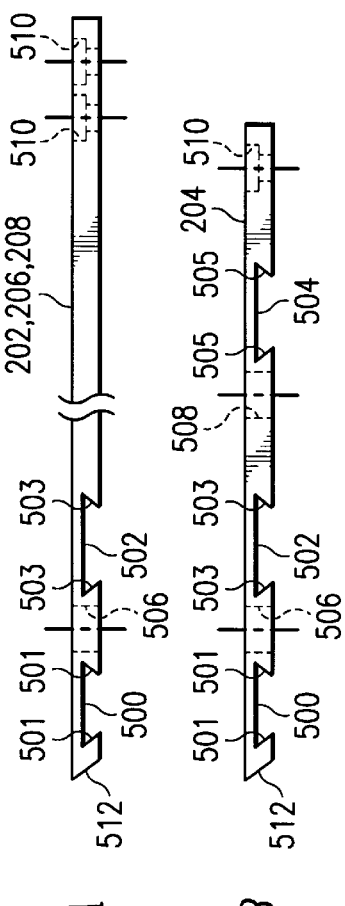
FIG. 6 is a side view of the power supply bus bars of FIG. 5.
Figure 6B:
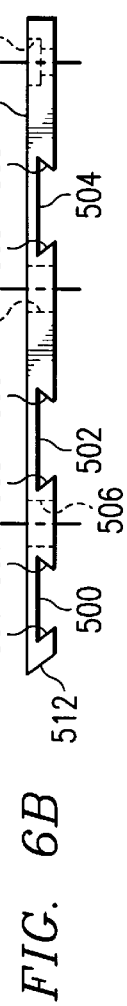
Figure 7:
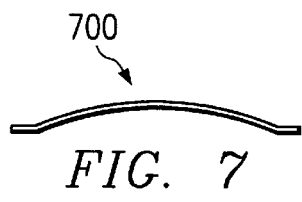
FIGS. 7 and 8 are side and oblique views, respectively, of a resilient conducting member for use with the power supply bus bars of FIGS. 5–6.
Figure 9:
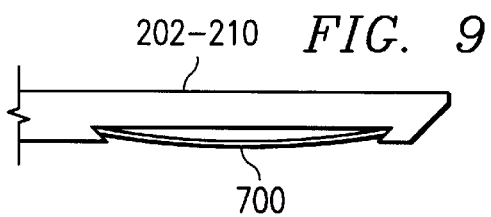
FIGS. 9 and 10 are side and bottom views, respectively, illustrating the resilient conducting member of FIGS. 7–8 having been installed in a power supply bus bar in a preferred manner.
Figure 8:
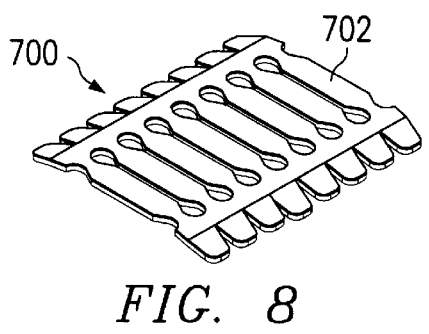
Figure 10:
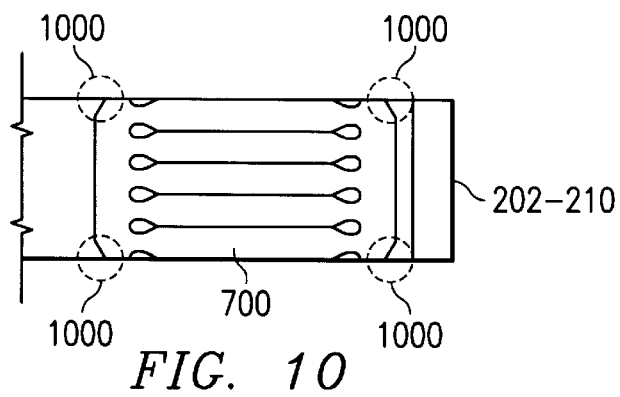

FIGS. 5–10 illustrate power supply bus bars 202–208 in more detail. Each power supply bus bar includes two transverse channels 500, 502. In addition to the two transverse channels 500, 502, power supply bus bar 204 includes a third transverse channel 504. A resilient conducting member 700 is preferably placed in each of channels 500–504 so that a convex surface of resilient conducting member 700 extends slightly above the top of the channel as shown in FIG. 9. A suitable material for use as resilient conducting member 700 would be the LOUVERTAC product manufactured and sold by AMP, Inc., Harrisburg, Pa. 17105. It is believed that the LOUVERTAC product is made of a beryllium-copper alloy plated with silver. Each strip of LOUVERTAC includes a plurality of slats 702. Each slat 702 is rotated slightly about its longitudinal axis so that one edge of each slat will make contact with any surface that is urged against the convex surface of resilient conducting member 700. Other resilient conductive materials may be used with similar effect. In a preferred embodiment, the sides 501, 503, 505 of each transverse channel were dovetailed as shown in FIG. 6 to facilitate installation and retention of resilient conducting members 700. In order to further ensure proper retention of resilient conducting members 700 within transverse channels 500, 502, 504, each corner of each channel was deformed down and over an edge of the resilient conducting member as shown at 1000 in FIG. 10.

Each power supply bus bar 202–208 includes a fastener clearance hole 506 located between and approximately equidistant from channels 500 and 502. Power supply bus bar 204 further includes a fastener clearance hole 508 located relatively close to channel 504. Each of fastener clearance holes 506, 508 may be formed having an inside diameter that is larger in one direction than another, as shown, to allow adjustment when mating power supply bus bars 202–208 with printed circuit bus bars 1100–1104 to be discussed below. In an embodiment, power supply bus bars 202–208 were made of solid copper plated with gold. Each was approximately 3 mm thick. Power supply bus bar 204 was approximately 1.4 inches wide. Power supply bus bars 202, 206 and 208 were approximately 0.5 inches wide. The widest part of transverse channels 500, 502, 504 was approximately 17.8 mm. Each of the dovetailed walls of channels 500, 502, 504 defined an angle of approximately 30 degrees from the bottom of the channel. The smallest inside diameter of clearance holes 506, 508 was approximately 6 mm. The largest inside diameter was approximately 8 mm. For each of clearance holes 506, 508, the edge of the clearance hole nearest the adjacent channel was within approximately 0.5 mm of the channel edge. (Locating fastener clearance holes 506, 508 close to channels 500–504 enhances the quality of the electrical contact to be made between power supply bus bars 202–208 and printed circuit bus bars 1100–1104 to be discussed below.) Each of power supply bus bars 202–208 also includes a front-end bevel 512 that helps to guide printed circuit board bus bars 1100–1104 underneath power supply bus bars 202–208 when they are engaged with one another.

Although all of power supply bus bars 202–208 were of different length, the mating portion 400 of each was designed to extend from housing 200 by approximately 96 mm. In other embodiments, a different length may be used for mating portion 400 as well as the overall length of power supply bus bars 202–208. Preferably, however, the overall length of each power supply bus bar 202–208 should be long enough so that the power supply bus bars are somewhat compliant when they are engaged with printed circuit bus bars 1100–1104, but are nevertheless resilient when disengaged from printed circuit bus bars 1100–1104.

Preferably, power supply bus bars 202–208 are mounted to power supply components 302–308 in an adjustable manner. In the illustrated embodiment, this was accomplished using screw-type fasteners 310, each having a shaft diameter slightly smaller than the smallest inside diameter of its respective counter-bored clearance hole 510. In an embodiment, the large inside diameter of clearance holes 510 was approximately 11 mm. The small inside diameter of clearance holes 510 was approximately 6 mm. Access holes 210 were provided in power supply enclosure 200 so that the positions of power supply bus bars 202–208 could be fine-adjusted through housing 200 at assembly time without removing power supply 102 from chassis 100. Although specific materials and dimensions have been discussed herein with respect to the illustrated embodiment, it is believed that other materials and dimensions may be used with similar effect in other embodiments.

Figure 15:
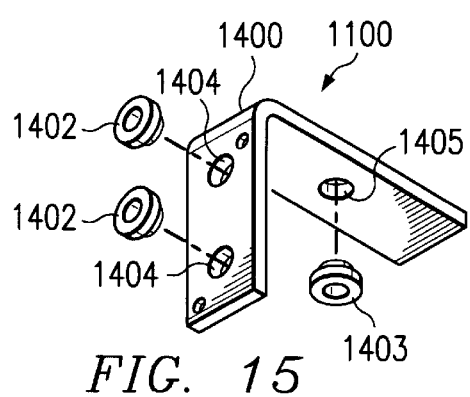
FIGS. 14 and 15 are side and oblique views, respectively, of a first type of printed circuit board bus bar shown in FIGS. 11–12.
Figure 16:
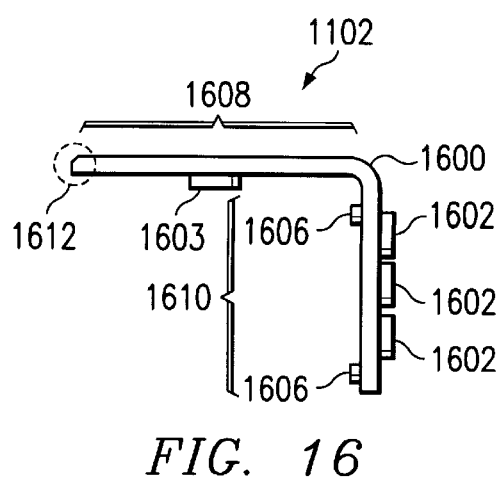
FIGS. 16 and 17 are side and oblique views, respectively, of a second type of printed circuit board bus bar shown in FIGS. 11–12.
Figure 11:
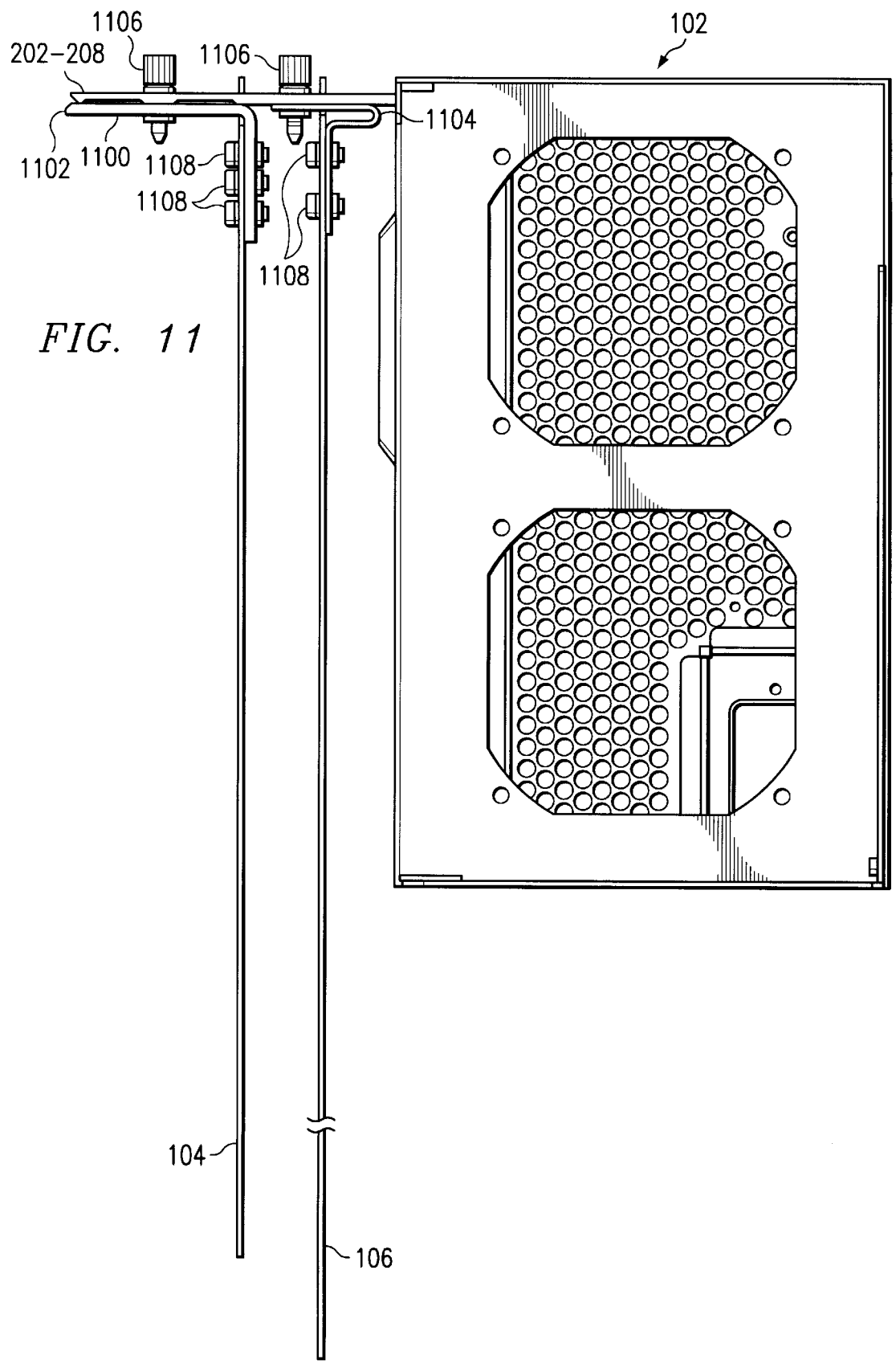
FIGS. 11 and 12 are side and top views, respectively, of the power supply, circuit boards and power bus system of FIG. 1.
Figure 12:
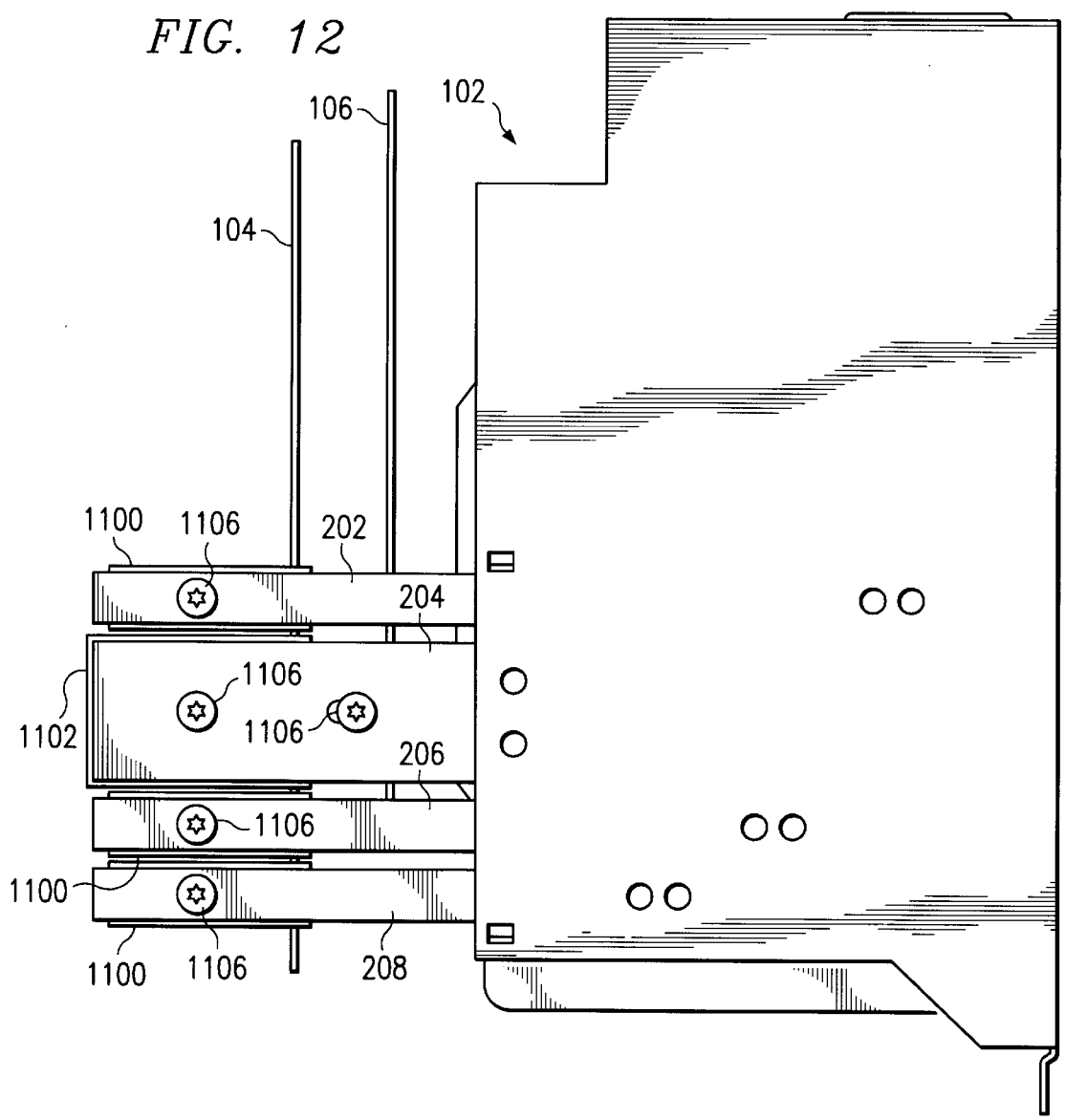
Figure 13:
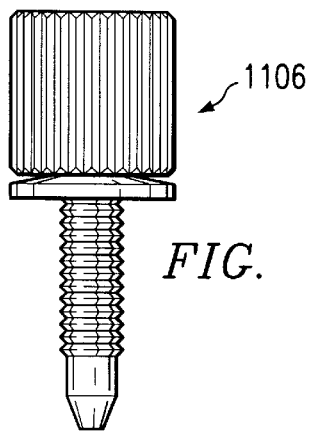
FIG. 13 is a side view of a representative one of the thumb screw fasteners shown in FIGS. 11–12.
Figure 14:
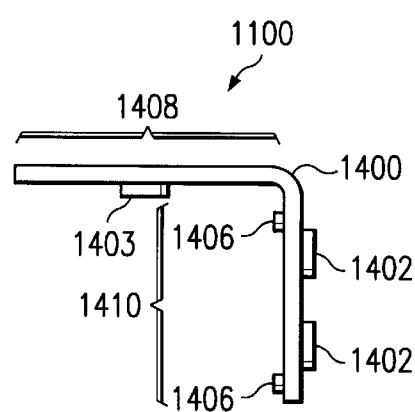
Figure 17:
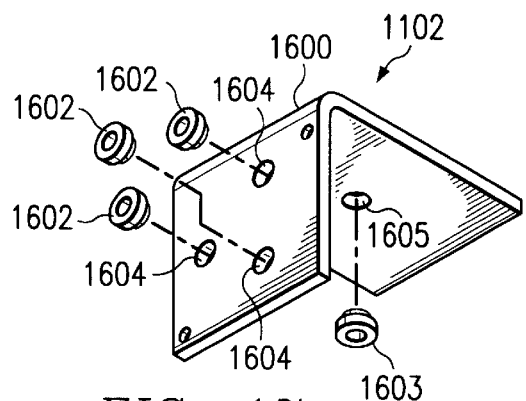
Figure 18:
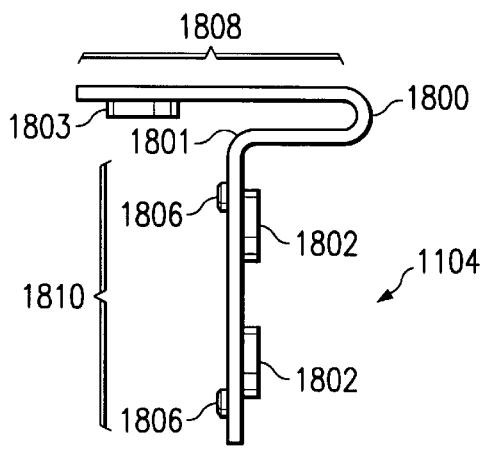
FIG. 18 is a side view of a third type of power supply bus bar shown in FIGS. 11–12.
Figure 19:
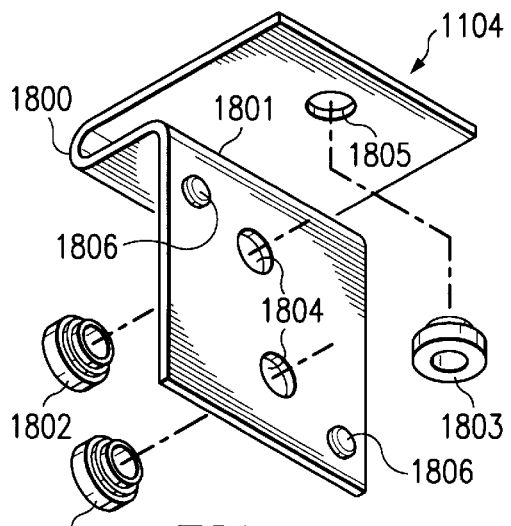
FIGS. 19 and 20 are oblique views of the printed circuit board bus bar of FIG. 18.
Figure 20:
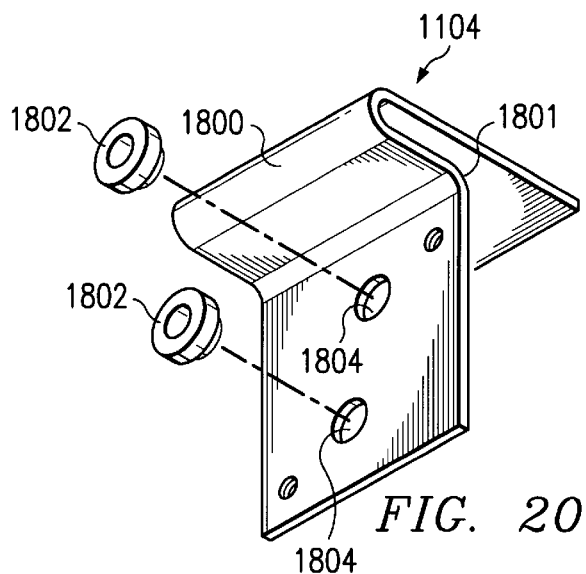

Printed circuit board bus bars 1100–1104 will now be discussed in detail with reference to FIGS. 11–22. Like power supply bus bars 202–208, printed circuit board bus bars 1100–1104 may be constructed of solid copper plated with gold. Their thickness and width dimensions are preferably similar to those of power supply bus bars 202–208. FIGS. 14 and 15 are side and oblique views, respectively, of printed circuit board bus bar 1100. Power bus system 108 includes three printed circuit board bus bars 1100, as may be seen in FIGS. 11 and 12. FIGS. 16 and 17 are side and oblique views, respectively, of printed circuit board bus bar 1102. Power bus system 108 includes one printed circuit board bus bar 1102, as may be seen in FIGS. 11 and 12. FIG. 18 is a side view of power supply bus bar 1104. FIGS. 19 and 20 are oblique views of printed circuit board bus bar 1104. Power bus system 108 includes one printed circuit board bus bar 1104, as may be seen in FIGS. 11 and 12.

Printed circuit board bus bars 1100 include a mating portion 1408 for engaging a mating portion 400 of power supply bus bars 202, 206 or 208, and a mounting portion 1410 for engaging printed circuit board 104. Threads 1402 are friction fit into receiving holes 1404 and are adapted to receive screws 1108 for mounting bus bar 1100 to circuit board 104 using screw clearance holes 2106. Thread 1403 is friction fit into receiving hole 1405 and is adapted to receive metal thumb screw 1106. Raised locating members 1406 are manufacturing aids for facilitating proper alignment of printed circuit board bus bar 1100 with mounting area 2100 on printed circuit board 104. Mounting area 2100 includes alignment holes 2104 for receiving raised locating members 1406. (In alternative embodiments, the raised locating members may be formed on the printed circuit board and the alignment holes formed in the bus bar.) Printed circuit board mounting areas 2100 preferably include a plurality of plated through holes that electrically connect the surface of mounting area 2100 with one or more power planes or traces within printed circuit board 104. In a preferred embodiment, on the order of 16 plated through holes per square centimeter were included in each mounting area 2100. It is believed that the plural plated through holes in mounting area 2100 create surface irregularities that enhance the electrical connection between the printed circuit board and printed circuit board bus bar 1100.

Printed circuit board bus bar 1102 includes a mating portion 1608 for engaging a mating portion 400 of power supply bus bar 204, and a mounting portion 1610 for engaging printed circuit board 104. Threads 1602 are friction fit into receiving holes 1604 and are adapted to receive screws 1108 for mounting bus bar 1102 to circuit board 104 using screw clearance holes 2110. Thread 1603 is friction fit into receiving hole 1605 and is adapted to receive thumb screw 1106. Raised locating members 1606 are used in the same manner as raised locating members 1406; they engage alignment holes 2108 in mounting area 2102. Mounting area 2102, like mounting area 2100, includes a plurality of plated through holes having the same function as those in mounting area 2100. Printed circuit bus bar 1102 preferably also includes a beveled tip 1612 located at the end of mating portion 1608, as shown. Beveled tip 1612 is used to engage resilient lever 2310 of insulating shield 2300 (to be further described below).

Printed circuit board bus bar 1104 includes a mating portion 1808 for engaging a mating portion 400 of power supply bus bar 204, and a mounting portion 1810 for engaging printed circuit board 106. Threads 1802 are friction fit into receiving holes 1804 and are adapted to receive screws 1108 for mounting bus bar 1104 to circuit board 106 using screw clearance holes 2206. Thread 1803 is friction fit into receiving hole 1805 and is adapted to receive thumb screw 1106. Raised locating members 1806 are used in the same manner as raised locating members 1406; they engage alignment holes 2204 in mounting area 2200. Mounting area 2200, like mounting area 2100, includes a plurality of plated through holes having the same function as those in mounting area 2100.

Each of printed circuit board bus bars 1100, 1102, 1104 includes a bend 1400, 1600, 1800 that performs at least two important functions: First, bends 1400, 1600, 1800 allow printed circuit boards 104, 106 to be mounted to chassis 100 in a plane that is not parallel with the plane of power supply bus bars 202–208. Indeed, printed circuit boards 104, 106 may be mounted to chassis 100 at any angle relative to the plane of power supply bus bars 202–208 as long as bends 1400, 1600, 1800 are of sufficient magnitude to create a parallel relationship between power supply bus bars 202–208 and mating portions 1408, 1608, 1808. Second, the large radius of bends 1400, 1600 facilitates installation of circuit board 104 into chassis 100: Specifically, as the printed circuit board is moved in direction "a" during installation, bends 1400, 1600 engage front-end bevels 512 on power supply bus bars 202–208 and guide printed circuit board bus bars 1102, 1104 underneath power supply bus bars 202–208 to their proper position.

Printed circuit board bus bar 1106 includes a 90-degree bend 1801 in addition to 180-degree bend 1800. Bends 1800 and 1801 act in concert not only to achieve all of the functionality described in the preceding paragraph, but also (1) to center mating portion 1808 of power supply bus bar 1104 above printed circuit board 106, thus conserving space within chassis 100 without sacrificing mating area; and (2) to provide additional compliance in the printed circuit bus bar itself.

Figure 23:
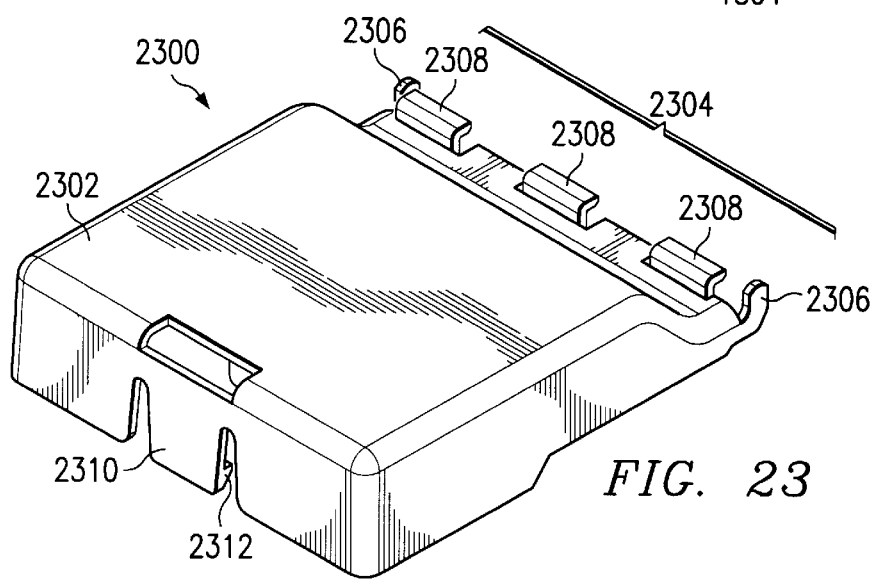
FIG. 23 is an oblique view of an insulating shield for use with the power bus system of FIG. 1 according to a preferred embodiment of the invention.
Figure 22:
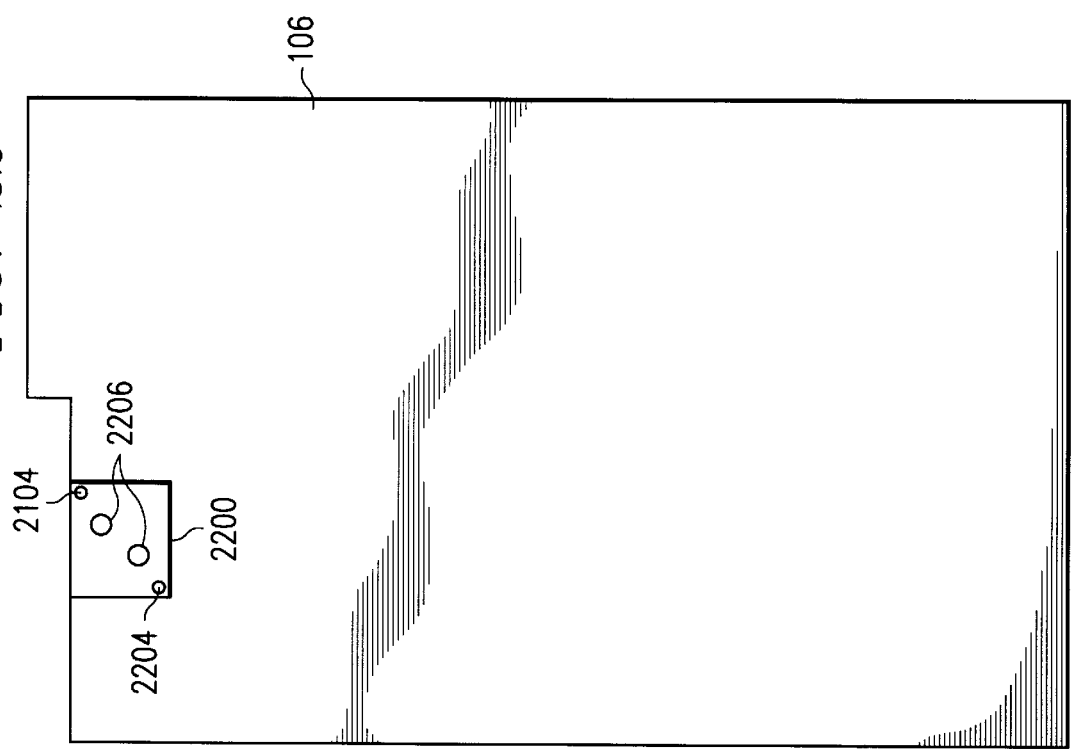
FIG. 22 is a plan view of the other printed circuit board shown in FIGS. 11–12.
Figure 21:
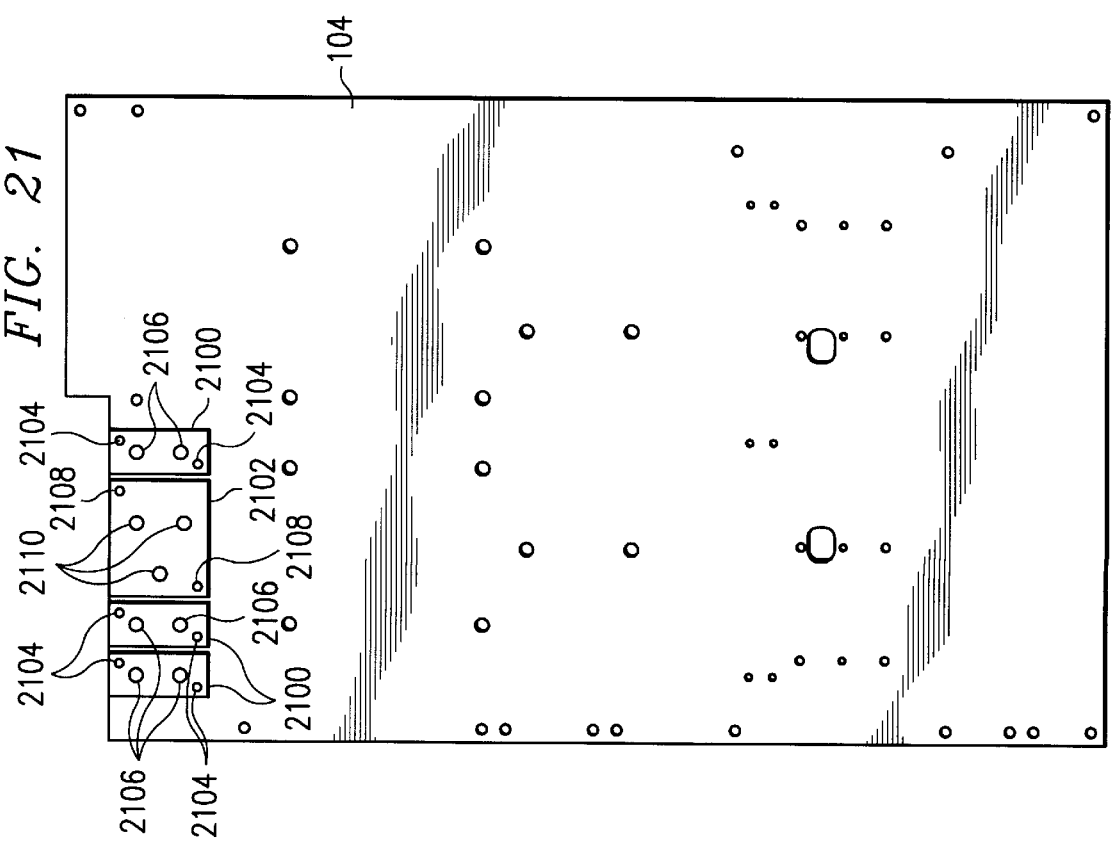
FIG. 21 is a plan view of one of the printed circuit boards shown in FIGS. 11–12.
Figure 24:
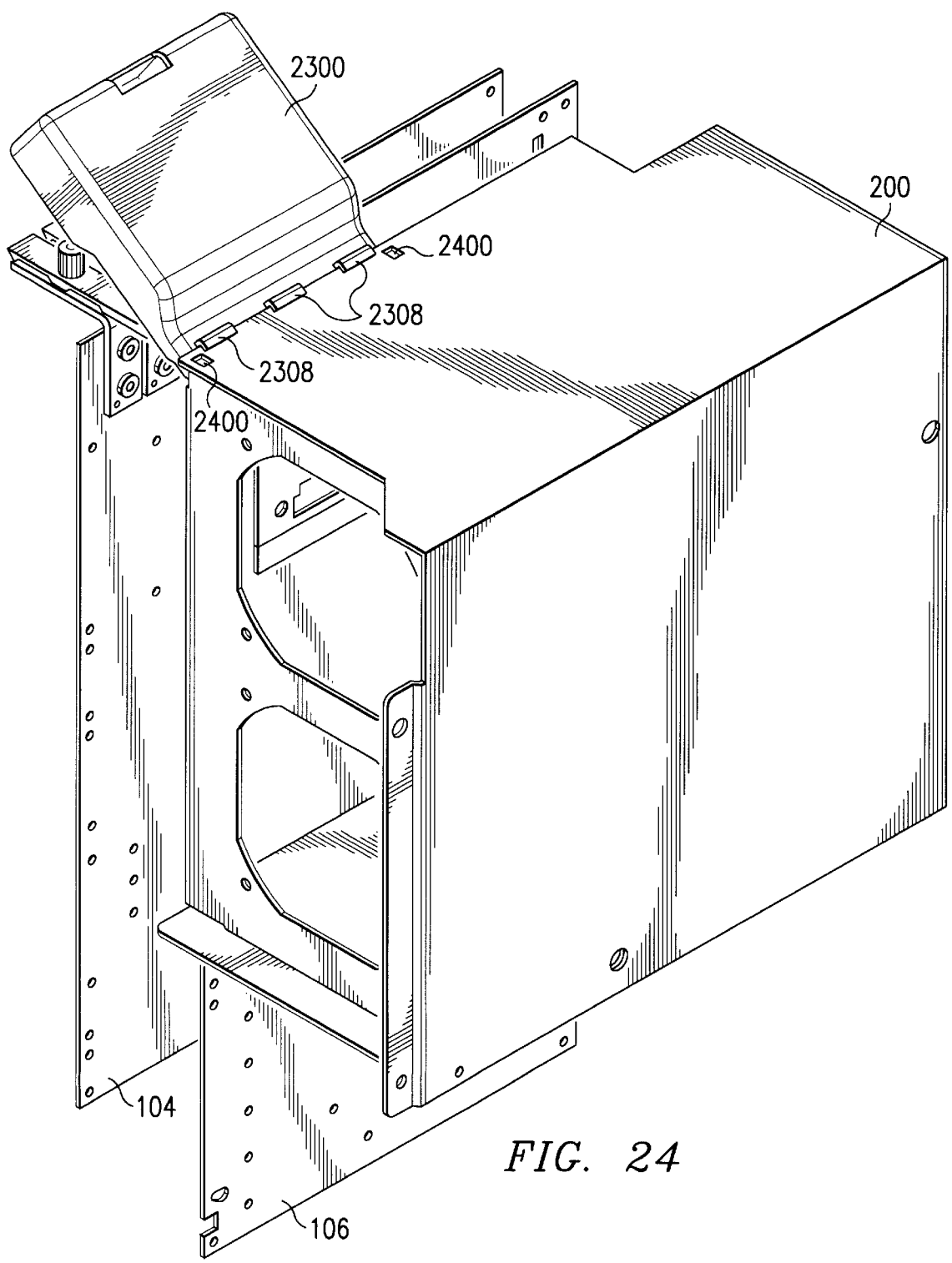
FIG. 24 is an oblique view of the insulating shield of FIG. 23 having been hingedly engaged with the power supply housing shown in FIG. 1.
Figure 25:
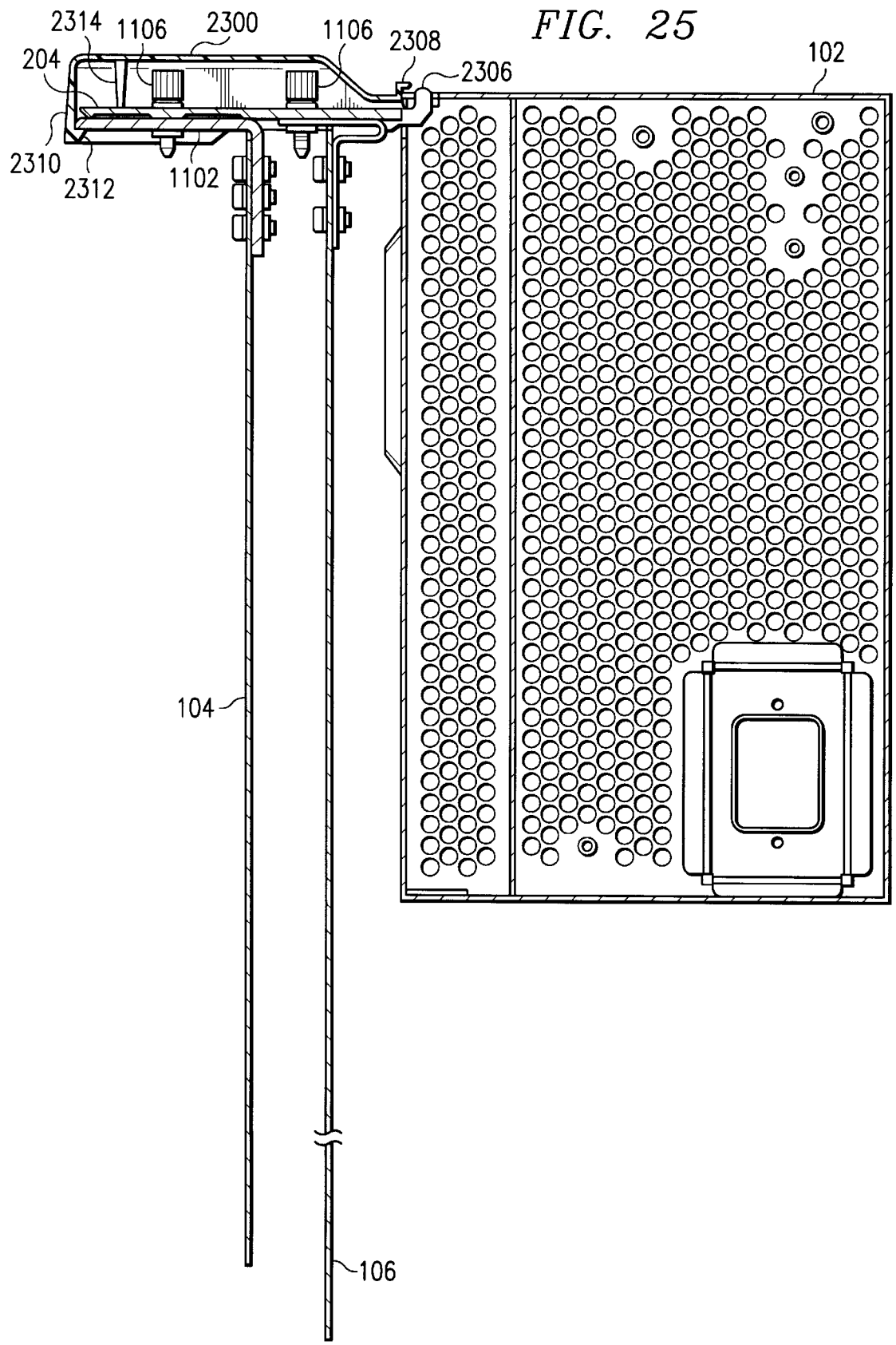
FIG. 25 is a sectional side view of the insulating shield of FIGS. 23 and 24 having been hinged downward and snapped over the end of one of the printed circuit bus bars.

It is a further feature of the invention that a removable insulating shield 2300 (FIGS. 23–25) may be used to cover power bus system 108 for protection against short circuits or electrical shocks during operation. In a preferred embodiment, insulating shield 2300 may be formed of molded plastic. It includes a hinge member 2304 on one end for engaging power supply housing 200. Specifically, hinge members 2306 engage hinge holes 2400 from underneath, as shown in FIG. 24, while hinge members 2308 engage the top surface of housing 200. After hinge member 2304 has been engaged with power supply housing 200, insulating shield 2300 may be rotated down over power bus system 108 as shown in FIG. 25. Resilient plastic lever 2310 slips over beveled tip 1612 on printed circuit board bus bar 1102 until catch 2312 engages the underside of bus bar 1102, thereby holding insulating shield 2300 in place. Standoff 2314 engages the top side of power supply bus bar 204, as shown. To remove insulating shield 2300, lever 2310 is simply pulled away from the end of bus bar 1102. The shield may then be rotated up to the position shown in FIG. 24 and disengaged from housing 200.

While the invention has been described in detail in relation to a preferred embodiment thereof, the described embodiment has been presented by way of example and not by way of limitation. It will be understood by those skilled in the art that various changes may be made in the form and details of the described embodiment, resulting in equivalent embodiments that will remain within the scope of the appended claims.

What is claimed is:

1. A power bus system, comprising:
   a power supply mounted to a chassis;
   a power supply bus bar extending from the power supply and defining a power supply bus bar plane;
   a first printed circuit board mounted to the chassis and oriented in a plane that is not parallel with the power supply bus bar plane; and
   a first printed circuit board bus bar extending from the first printed circuit board;
   wherein at least one of the power supply bus bar and the first printed circuit board bus bar includes a bend sufficient to create a parallel relationship between a mating portion of the power supply bus bar and a mating portion of the first printed circuit board bus bar; and a first fastener coupling the mating portion of the power supply bus bar to the mating portion of the first printed circuit board bus bar.

2. The power bus system of claim 1, wherein at least one of the power supply bus bar and the first printed circuit board bus bar has sufficient length that it is compliant when urged against the other bus bar but resilient when separated from the other bus bar.

3. The power bus system of claim 1, further comprising:

a second printed circuit board mounted to the chassis and oriented in a plane that is substantially at right angles with the power supply bus bar plane;

a second printed circuit board bus bar extending from the second printed circuit board;

wherein the second printed circuit board bus bar includes a 90-degree bend and a 180-degree bend such that a mating portion of the second printed circuit board bus bar is oriented at right angles with the plane of the second printed circuit board and parallel with the power supply bus bar plane; and a second fastener coupling the mating portion of the power supply bus bar to the mating portion of the second printed circuit board bus bar.

4. The power bus system of claim 3, wherein lengths adjacent to the 90-degree and 180-degree bends are sufficiently long that the second printed circuit board bus bar is compliant when urged against the power supply bus bar but resilient when separated from the power supply bus bar.

5. The power bus system of claim 1, wherein the first printed circuit board includes a mounting area for engagement with a mounting portion of the first printed circuit board bus bar, the mounting area including a plurality of plated through holes, at least one of the plural plated through holes electrically connected to a power trace of the first printed circuit board, and the mounting area further including at least one manufacturing aid chosen from the following group: a hole formed in the first printed circuit board for receiving a raised locating member formed on the first printed circuit board bus bar, and a raised locating member formed on the first printed circuit board for engaging a hole formed in the first printed circuit board bus bar.

6. The power bus system of claim 1, wherein the power supply bus bar is adjustably mounted to a component of the power supply such that it may be translated within the power supply bus bar plane for the purpose of aligning the mating portion of the power supply bus bar with the mating portion of the first printed circuit board bus bar and then fixed into position after alignment has been achieved.

7. The power bus system of claim 6, wherein the adjustable mount of the power supply bus bar to a component of the power supply is achieved with a screw-type fastener whose screw shaft diameter is smaller than at least one inside dimension of a clearance hole formed in the power supply bus bar through which the screw-type fastener passes.

8. The power bus system of claim 1, further comprising:

a channel formed in the mating portion of at least one of the power supply bus bar and the first printed circuit board bus bar; and a resilient conducting member disposed within the channel, the resilient conducting member having a convex portion that extends beyond the top of the channel.

9. The power bus system of claim 8, wherein the resilient conducting member is retained within the channel by at least one deformation created in a portion of a wall of the channel.

10. The power bus system of claim 1 further comprising an insulating shield, the insulating shield comprising:

a hinge member for engaging the power supply; and a resilient lever having a catch formed thereon for engaging at least one of the power supply bus bar and first printed circuit board bus bar.

11. A power bus system, comprising:

a power supply mounted to a chassis;

a power supply bus bar extending from the power supply and defining a power supply bus bar plane;

a first printed circuit board mounted to the chassis;

a first printed circuit board bus bar extending from the first printed circuit board;

wherein a mating portion of the power supply bus bar and a mating portion of the first printed circuit board bus bar are disposed in parallel relationship with one another;

a channel formed in the mating portion of at least one of the power supply bus bar and the first printed circuit board bus bar; and a resilient conducting member disposed within the channel, the resilient conducting member having a convex portion that extends beyond the top of the channel.

12. The power bus system of claim 11, wherein the resilient conducting member is retained within the channel by at least one deformation created in a portion of a wall of the channel.

13. The power bus system of claim 11, wherein the first printed circuit board includes a mounting area for engagement with a mounting portion of the first printed circuit board bus bar, the mounting area including a plurality of plated through holes, at least one of the plural plated through holes electrically connected to a power trace of the first printed circuit board, and the mounting area further including at least one manufacturing aid chosen from the following group: a hole formed in the first printed circuit board for receiving a raised locating member formed on the first printed circuit board bus bar, and a raised locating member formed on the first printed circuit board for engaging a hole formed in the first printed circuit board bus bar.

14. The power bus system of claim 11, wherein the power supply bus bar is adjustably mounted to a component of the power supply such that it may be translated within the power supply bus bar plane for the purpose of aligning the mating portion of the power supply bus bar with the mating portion of the first printed circuit board bus bar and then fixed into position after alignment has been achieved.

15. The power bus system of claim 14, wherein the adjustable mount of the power supply bus bar to a component of the power supply is achieved with a screw-type fastener whose screw shaft diameter is smaller than at least one inside dimension of a clearance hole formed in the power supply bus bar through which the screw-type fastener passes.

16. The power bus system of claim 11 further comprising an insulating shield, the insulating shield comprising:

a hinge member for engaging the power supply; and a resilient lever having a catch formed thereon for engaging at least one of the power supply bus bar and first printed circuit board bus bar.

17. A power bus system, comprising:
a power supply mounted to a chassis;
a power supply bus bar extending from the power supply and defining a power supply bus bar plane;
a printed circuit board mounted to the chassis and oriented in a plane that is substantially at right angles with the power supply bus bar plane;
a printed circuit board bus bar extending from the printed circuit board;
wherein the printed circuit board bus bar includes a 90-degree bend and a 180-degree bend such that a mating portion of the printed circuit board bus bar is oriented at right angles with the plane of the printed circuit board and parallel with the power supply bus bar plane; and
a fastener coupling the mating portion of the power supply bus bar to the mating portion of the printed circuit board bus bar.

18. The power bus system of claim 17, wherein the 180-degree bend has a sufficiently large radius that the printed circuit board bus bar is compliant when urged against the power supply bus bar but resilient when separated from the power supply bus bar.

19. A power bus system, comprising:
a power supply mounted to a chassis;
a power supply bus bar extending from the power supply and defining a power supply bus bar plane;
a printed circuit board mounted to the chassis;
a printed circuit board bus bar extending from the printed circuit board;
wherein a mating portion of the printed circuit board bus bar is in parallel relationship and makes electrical contact with a mating portion of the power supply bus bar; and
an insulating shield, the insulating shield comprising:
a hinge member for engaging the power supply; and
a resilient lever having a catch formed thereon for engaging at least one of the power supply bus bar and the printed circuit board bus bar.

* * * * *